United States Patent
Honda et al.

(10) Patent No.: US 7,550,975 B2
(45) Date of Patent: Jun. 23, 2009

(54) PORTABLE INFORMATION TERMINAL APPARATUS AND VOLTAGE MEASUREMENT APPARATUS

(75) Inventors: Kouhei Honda, Tokyo (JP); Naoki Kurihara, Tokyo (JP)

(73) Assignees: Fujitsu Limited, Kawasaki (JP); Fujitsu Frontech Limited, Tokyo (JP)

( * ) Notice: Subject to any disclaimer, the term of this patent is extended or adjusted under 35 U.S.C. 154(b) by 122 days.

(21) Appl. No.: 11/442,610

(22) Filed: May 30, 2006

(65) Prior Publication Data

US 2007/0176592 A1 Aug. 2, 2007

(30) Foreign Application Priority Data

Jan. 30, 2006 (JP) ............................. 2006-021512

(51) Int. Cl.
- *G01N 27/416* (2006.01)
- *G01R 31/04* (2006.01)
- *G08B 21/00* (2006.01)

(52) U.S. Cl. ...................... 324/433; 340/636.15; 702/63

(58) Field of Classification Search ................. 324/115, 324/99 D, 433, 425, 426; 340/636.1–636.21; 702/63; 713/340

See application file for complete search history.

(56) References Cited

U.S. PATENT DOCUMENTS 5,712,568 A * 1/1998 Flohr et al. ................. 324/434

FOREIGN PATENT DOCUMENTS

| JP | 2000-162251 A | 6/2000 |
| JP | 2001-282368 A | 10/2001 |
| JP | 3609027 B2 | 10/2004 |

* cited by examiner

*Primary Examiner*—Ernest F Karlsen
(74) *Attorney, Agent, or Firm*—Westerman, Hattori, Daniels & Adrian, LLP.

(57) ABSTRACT

The measurement unit measures a voltage by converting it from analog to digital and outputs a measurement value. The changeover unit, being connected to a battery and a reference voltage source generating a highly accurate fixed voltage, selects one of them and applies it to the measurement unit. The voltage value output unit makes the changeover unit select a fixed voltage generated by a predetermined voltage source, makes the measurement unit measure it as a reference voltage and generates calculation-use information for calculating a voltage value from a measurement result based on a measurement value of the fixed voltage and a voltage value of the reference voltage. The voltage value output unit, when making the changeover unit select a voltage of the battery and making the measurement unit measure it, uses the measurement value of it and the calculation-use information to calculate and output a voltage value of the battery.

7 Claims, 6 Drawing Sheets

PORTABLE INFORMATION TERMINAL APPARATUS AND VOLTAGE MEASUREMENT APPARATUS

BACKGROUND OF THE INVENTION

1. Field of the Invention

The present invention relates to a portable information terminal apparatus such as a portable telephone, a PDA (Personal Digital Assistance), an HHT (Hand Held Terminal), a lap top PC (Personal Computer), and a voltage measurement apparatus installed therein; and in particular to a technique aiming at measuring a voltage value of a power supply-use battery with maintaining accuracy.

2. Description of the Related Art

A portable information terminal apparatus (simply "portable information terminal" hereinafter) is usually configured to be operable by a rechargeable battery. A capacity of the battery equipped on the portable information terminal is limited. Accordingly the majority of portable information terminals is equipped with the function (called a "battery monitor function" hereinafter) of displaying a remaining battery capacity or issuing a warning when the voltage value becomes no more than a certain value. An implementation of the function requires a measurement of a voltage of a battery. The measurement commonly uses an analog-to-digital converter ("ADC" hereinafter). This is because a voltage value can be handled by a digital value.

An ADC has an individual variation. There are many cases of using a configuration in which a voltage is applied to the ADC by dividing the voltage, and a resistance value of a resistor used therefor has a certain degree of variation. Due to this reason, some conventional voltage measurement apparatuses, such as the one noted in a patent document 3 for instance, among those which measure a voltage by using an ADC, are configured to have the capability of measuring a voltage highly accurately regardless of the above explained variation or error.

A conventional voltage measurement apparatus noted in the patent document 3 first connects an ADC to a reference power source which generates a high accuracy voltage, makes the ADC measure the voltage value and stores the measurement value in nonvolatile memory. It then connects an AC (alternate current) adaptor to the ADC, measures its voltage value, calculates a correction value from the two measurement values and stores the correction value in the nonvolatile memory, followed by calculating a voltage value of the AC adaptor by using a measurement result of the ADC and the correction value.

A use of the correction value for calculating a voltage value makes it possible to measure a voltage highly accurately. The conventional voltage measurement apparatus noted in the patent document 3 is configured to manually change over, by way of a connector, a power source connecting to the ADC. Due to this, work efficiency is low, that is, a cumbersome operation is necessary for a high accuracy measurement. This fact has required a technique for allowing a high accuracy measurement without involving a cumbersome operation.

In the meantime, there are some ADCs which measure a voltage value of a voltage as the subject of measurement by applying two voltages. Conventional voltage measurement apparatuses using such ADC include the one noted in patent documents 1 and 2 for example.

[Patent Document 1] Japanese Registered Patent No. 3609027 (i.e., Laid-Open Japanese Patent Application Publication No. 2002-221544)

[Patent Document 2] Laid-Open Japanese Patent Application Publication No. 2000-162251

[Patent Document 3] Laid-Open Japanese Patent Application Publication No. 2001-282368

SUMMARY OF THE INVENTION

The purpose of the present invention is to provide a technique allowing a voltage measurement with maintaining high accuracy and without requiring an operator for a cumbersome operation.

According to the present invention, a portable information terminal apparatus, being equipped with a battery and one or more voltage sources for generating a fixed voltage from the battery, includes a measurement unit, a changeover unit and a voltage value output unit. The measurement unit measures an applied voltage by converting it from analog to digital (A/D) and outputs a measurement value according to the voltage height. The changeover unit is applied by a plurality of voltages including at least respective voltages of the battery and the voltage source. The changeover unit selects one of the plurality of voltages and applies the selected voltage to the measurement unit. The voltage value output unit makes the changeover unit select a fixed voltage generated by a predetermined voltage source from among the plurality of voltages, makes the measurement unit measure the fixed voltage as a reference voltage, generates calculation-use information for the purpose of calculating a voltage value from a measurement result of the measurement unit based on a first measurement value obtained as the measurement result of the fixed voltage and a voltage value of the reference voltage and calculates, and outputs, a voltage value of the battery by using a second measurement value that is the measurement result of a voltage of the battery and the calculation-use information in the case of making the changeover unit select the voltage of the battery and making the measurement unit measure the voltage of the battery. Also according to the present invention, a voltage measurement apparatus, being equipped on a portable information terminal apparatus which is operable by a battery, includes a measurement unit, a changeover unit and a voltage value output unit which are the same as the above described.

The present invention utilizes a voltage source which generates a known stable voltage (i.e., a fixed voltage) by using an electric current supplied from a battery and uses the fixed voltage for creating calculation-use information for calculating a voltage value matching with a measurement accuracy of the measurement unit. A creation of the calculation-use information enables the measurement unit adequately respond, including a state of being equipped on a portable information terminal apparatus. It enables a measurement of a value of a battery voltage to maintain accuracy regardless of a variation of measurement accuracy for each of the measurement units or a variation of a resistor connected to the measurement unit. This also makes it easy to validate for the purpose of rejecting a measurement unit whose measurement error is outside a tolerance range during a production process of an apparatus equipped with a voltage measurement apparatus according to the present invention or of a portable information terminal apparatus according thereto.

DESCRIPTION OF THE PREFERRED EMBODIMENTS

The following is a detailed description of the preferred embodiment of the present invention by referring to the accompanying drawings.

Figure 1:
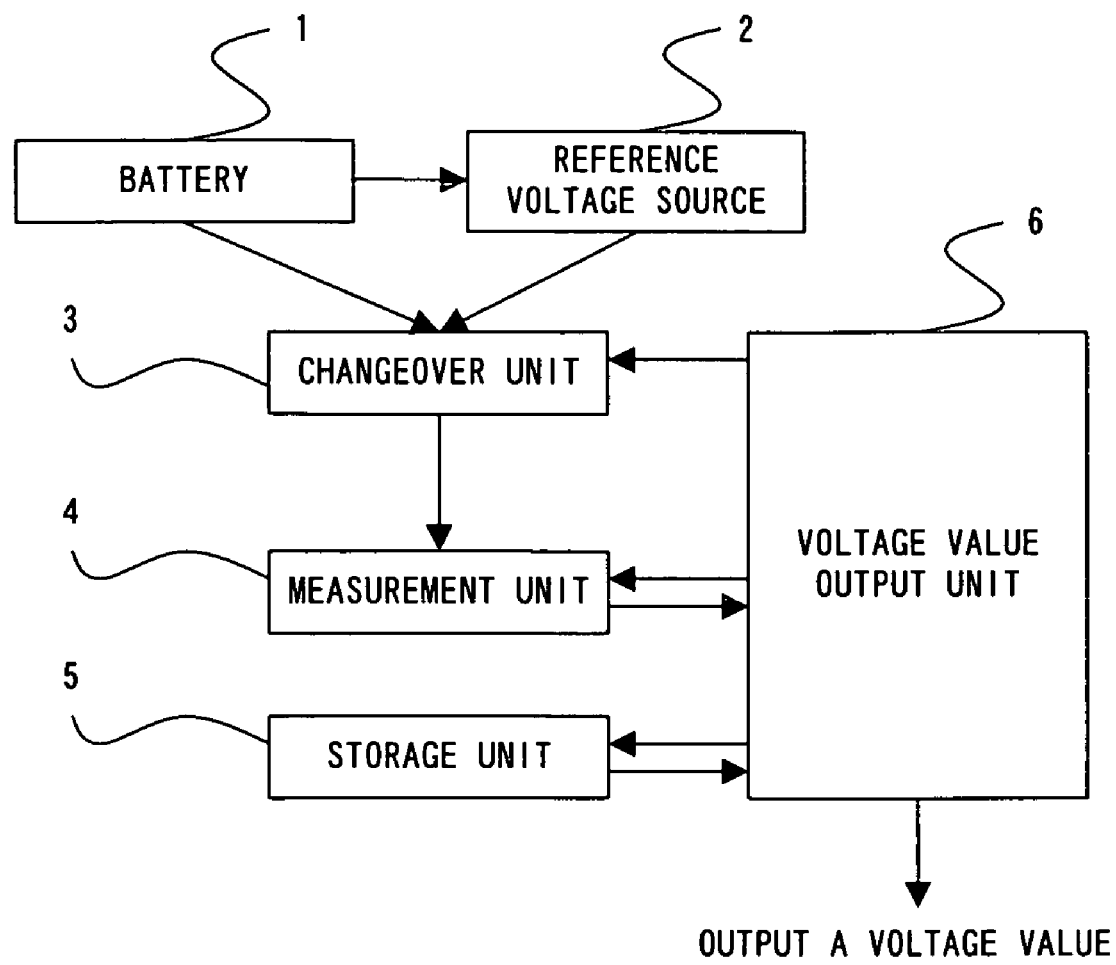
FIG. 1 is a diagram showing the principle of the present invention.

FIG. 1 is a diagram showing the principle of the present invention. Apparatuses according to the present invention (i.e., a portable information terminal apparatus and a voltage measurement apparatus) comprise a changeover unit 3, a measurement unit 4, a storage unit 5 and a voltage value output unit 6. The measurement unit 4 measures an applied voltage by converting it from analog to digital (A/D) and outputs a measurement value according to the voltage height. The changeover unit 3, being connected at least to the battery 1 and a reference voltage source 2 generating a highly accurate fixed voltage, selects one of the connected plurality of voltage sources and applies the selected voltage to the measurement unit 4. The voltage value output unit 6 makes the changeover unit 3 select a fixed voltage generated by a predetermined voltage source from among a plurality thereof, makes the measurement unit 4 measure the fixed voltage as a reference voltage and generates calculation-use information for the purpose of calculating a voltage value from a measurement result of the measurement unit 4 based on a first measurement value obtained as the measurement result of the fixed voltage and a voltage value of the reference voltage. And, the voltage value output unit 6 calculates, and outputs, a voltage value of the battery 1 by using a second measurement value that is the measurement result of a voltage of the battery 1 and the calculation-use information in the case of making the changeover unit 3 select the voltage of the battery 1 and making the measurement unit 4 measure the voltage.

Figure 2:
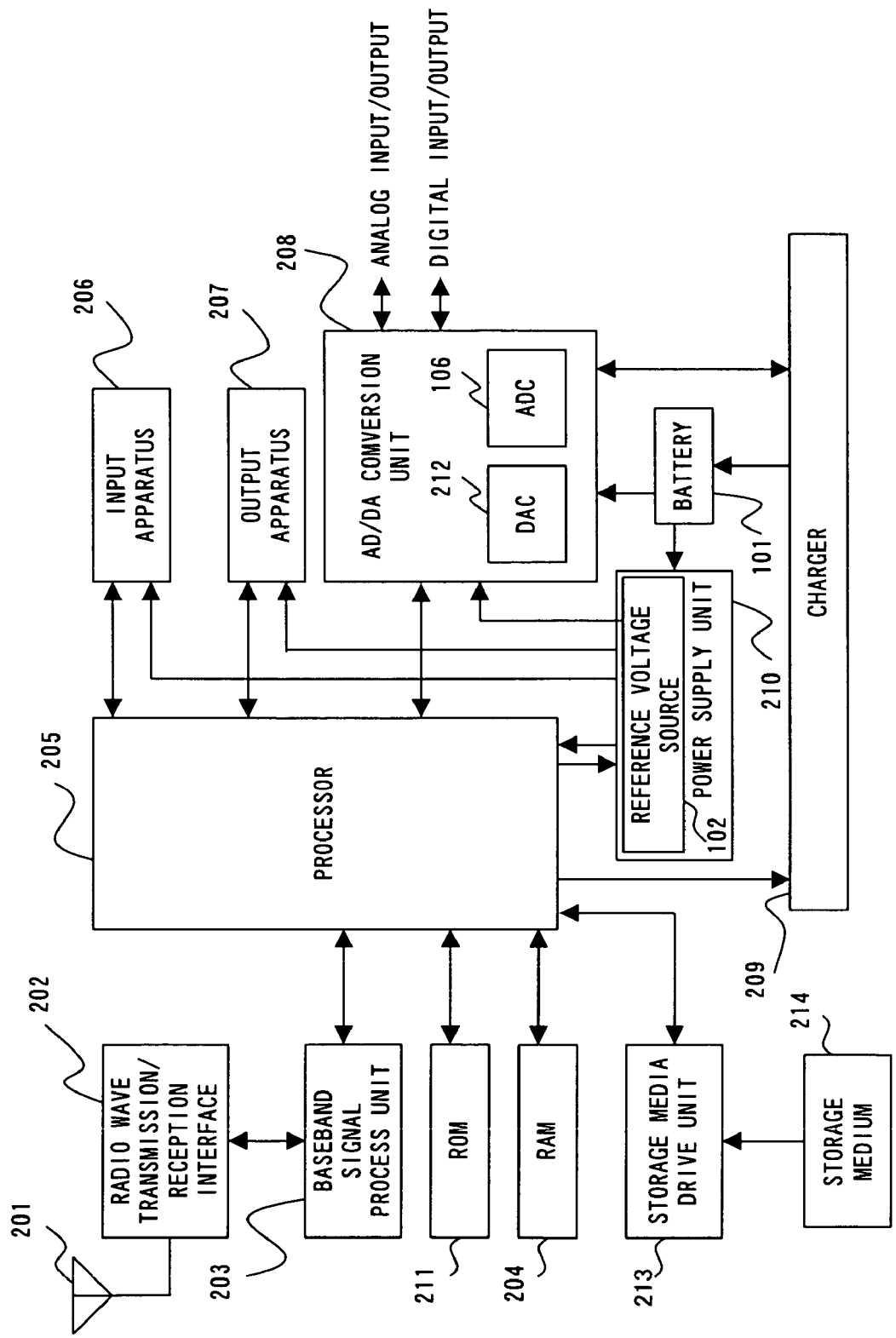
FIG. 2 is a block diagram of a portable information terminal apparatus according to an embodiment of the present invention.

FIG. 2 is a block diagram of a portable information terminal apparatus (simply "portable information terminal" hereinafter) according to an embodiment of the present invention. The portable information terminal is an HHT (hand-held terminal) equipped with a telecommunication function for example. As shown by FIG. 2, it comprises an antenna unit 201, a radio wave transmission/reception interface 202, a baseband signal process unit 203, a ROM (read only memory) 211, a RAM (random access memory) 204, a storage media drive unit 213, a processor 205, an input apparatus 206, an output apparatus 207, an AD/DA (analog-to-digital/digital-to-analog) conversion unit 208, a charger 209 and a power supply unit 210, and allows an equipment of a battery 101 as a power source. The battery 101 is a secondary battery charged by the charger 209 which is disposed to charge the battery 101 under the condition of an electric current being supplied by an external power source (not shown herein). Note that a portable information terminal which is operable by the battery 101 may be other than the HHT and rather a portable phone, a PDA (personal digital assistant), a laptop PC (personal computer) or a digital camera, for example. The battery 101 may be external.

A telecommunication function is implemented by the antenna unit 201, radio wave transmission/reception interface 202 for performing a modulation and demodulation of a signal, and baseband signal process unit 203.

The ROM 211 stores a program and various control-use data used by the portable information terminal. Nonvolatile memory such as flash memory may be used in lieu of the ROM 211. The RAM 204 is a work use for the processor 205 performing processes. The storage media drive unit 213 is disposed for accessing a portable storage medium 214 which is a memory card, for example.

The processor 205 executes the program stored by the ROM 211, thereby controlling the entirety of the portable information terminal. The program may be the one stored by the storage medium 214 or the one receivable by way of the telecommunication function.

The input apparatus 206 comprises a key board, a touch panel, a pointing device, and an interface for them for example. The output apparatus 207 is a liquid crystal display (LCD) for example.

The AD/DA conversion unit 208 includes an ADC 106 for performing an analog-to-digital conversion (A/D conversion) and a DAC (digital-to-analog converter) 212 for performing a digital-to-analog conversion (D/A conversion). The AD/DA conversion unit 208 is connected to an analog input/output terminal and a digital input/output terminal (neither of which is shown herein), thereby allowing a voice input and a voice output.

Among the devices or apparatuses constituting the portable information terminal, there are ones disposed to be respectively applied by predetermined fixed voltages (i.e., they correspond to, for example, the input apparatus 206, processor 205 and output apparatus 207 among the components shown in FIG. 2). The power supply unit 210 comprises a plurality of voltage sources for generating respective fixed voltages according to a voltage supplied from the battery 110. By this configuration, the power supply unit 210 applies voltages generated by the respective voltage sources to respective units to be applied to.

The battery 101 shown in FIG. 2 corresponds to the battery 1 shown in FIG. 1, while the processor 205 shown in FIG. 2 corresponds to the voltage output unit 6 shown in FIG. 1. The RAM 204 shown in FIG. 2 corresponds to the storage unit 5 shown in FIG. 1. The parts corresponding to the changeover unit 3 and measurement unit 4, both shown in FIG. 1, are included in the ADC 106 according to the present embodiment and are described later in association with FIG. 3.

A voltage value applied to the ADC is basically acquired by multiplying a digital value output therefrom by a value corresponding to a quantization step (i.e., calculation-use information; called a "step value" hereinafter). The present embodiment is configured to use the voltage source comprised by the power supply unit 210 in order to calculate a voltage value of the battery 101. The voltage source premises a reference voltage source 102. That is, the ADC 106 automatically measures, as a reference voltage, a fixed voltage which is highly accurately generated by the reference voltage source 102, acquires a step value at the event and uses the step value for calculating a voltage of the battery 101. This enables an automatic calculation of a step value and a high accuracy measurement of a voltage while freeing an operator from a necessity of a cumbersome operation.

Note that the above described step values maybe different per range of digital values. The step values may sometimes be different in a stepwise manner responding to the digital value for instance. However, it is assumed herein that the step value is all the same regardless of the digital value for a convenience of description.

Figure 3:
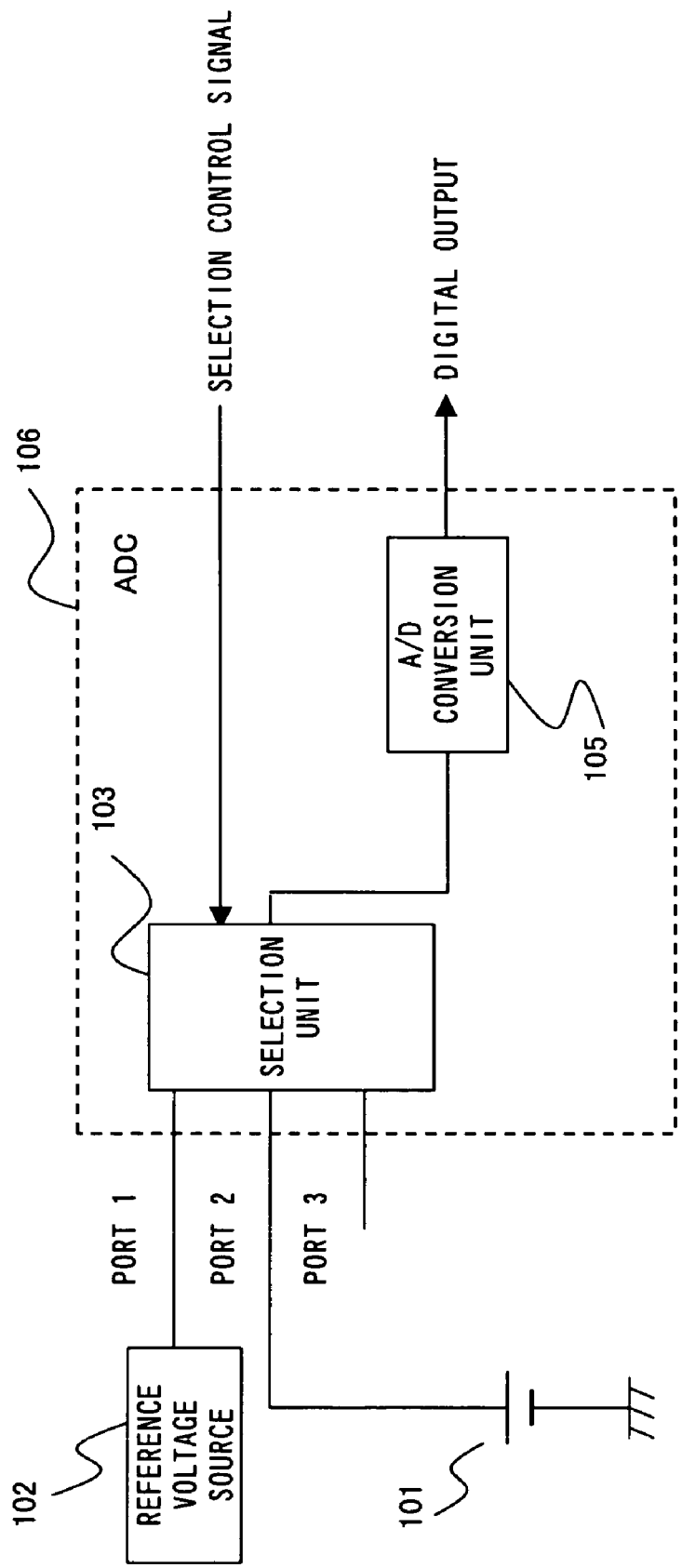
FIG. 3 is a circuit of an ADC.

FIG. 3 is a circuit of the above described ADC 106. FIG. 3 also shows a power source connected to the ADC 106.

The ADC 106 shown in FIG. 3 is equipped with ports 1, 2 and 3, with the port 1 being connected to the reference voltage source 102, and the port 2 being connected to the battery 101. A selection unit 103 for the purpose of selecting one port for measuring a voltage is installed within the ADC 106. The selection unit 103, being, for instance, a multiplexer, or a selector, selects a port according to a selection control signal which is output from the processor 205. An input voltage to the selected port is input to an A/D conversion unit 105, then converted thereby and output by a digital value. The digital value is input to the processor 205 which corresponds to the voltage value output unit 6 shown in FIG. 1. Incidentally, the above described number of ports may be discretionary.

Figure 4:
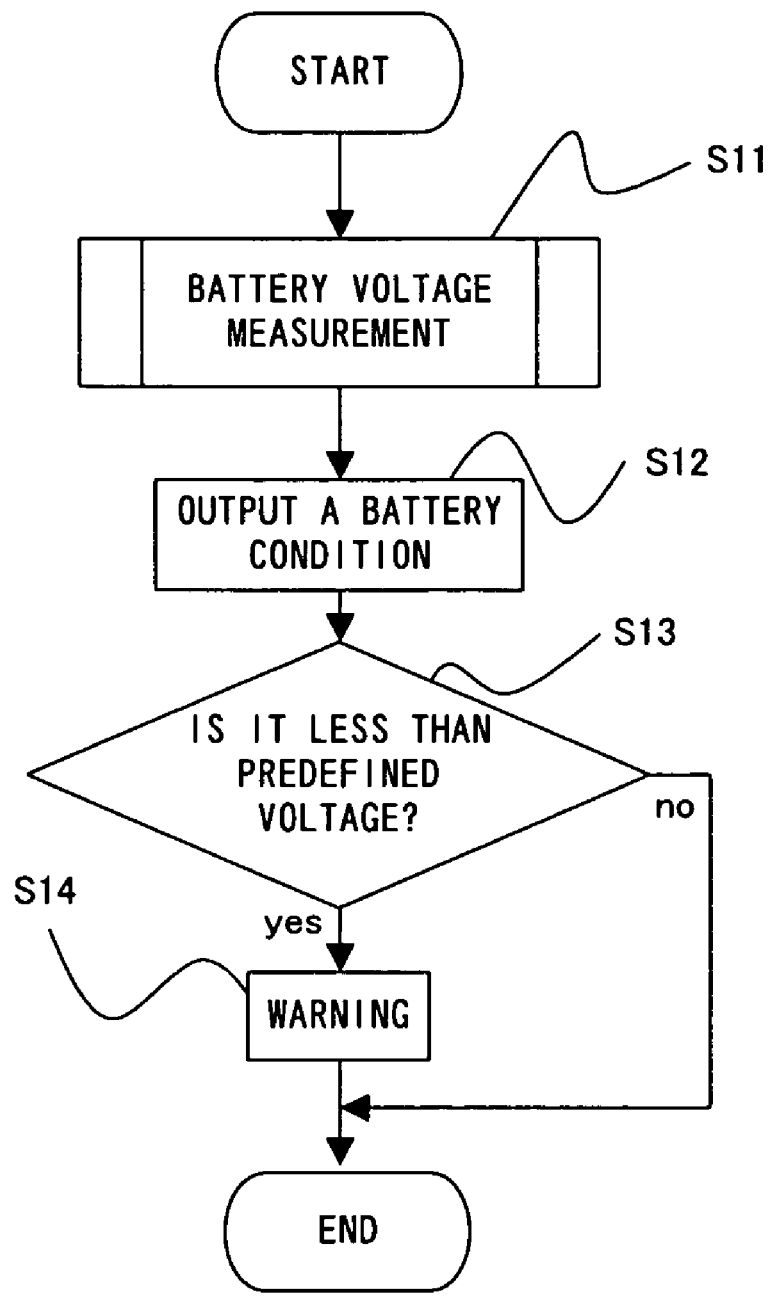
FIG. 4 is a flow chart showing a power source monitor process.

FIG. 4 is a flow chart showing a power source monitor process. The process is for the processor 205 executing at a prescribed time interval for example, in order to monitor a voltage (i.e., remaining) of the battery 101. The process is implemented by the processor 205 executing a program stored by the ROM 211. The next description is of the process in detail by referring to FIG. 4.

First, the OS (operating system) executes a battery voltage measurement process in order to obtain a voltage value of the battery 101 in the step S11. The execution is followed by a transition to the step S12.

In the step S12, the process makes the output apparatus 207 output information which indicates a state of the battery 101 according to the voltage value of the battery 101 obtained in the step S11. The output of the information is carried out by a remaining battery power displayed by a three-stage figure in the case of the output apparatus 207 being a display apparatus such as a liquid crystal display (LCD) for example. After making the output apparatus 207 perform the output in such a manner, the process shifts to the step S13.

The step S13 judges whether or not the voltage value obtained in the step S11 is less than a predefined value. If it is less than the predefined value, the judgment is "yes", thus proceeding to the step S14, while if it is not, then the judgment is "no" and a series of the processes ends here.

The above described predefined value is a voltage value considered as being necessary to start a recharging or replacement of the battery 101. Accordingly the step S14 displays a warning message to prompt a start of a recharging or a replacement of the battery 101. This is followed by ending a series of the processes.

Figure 5:
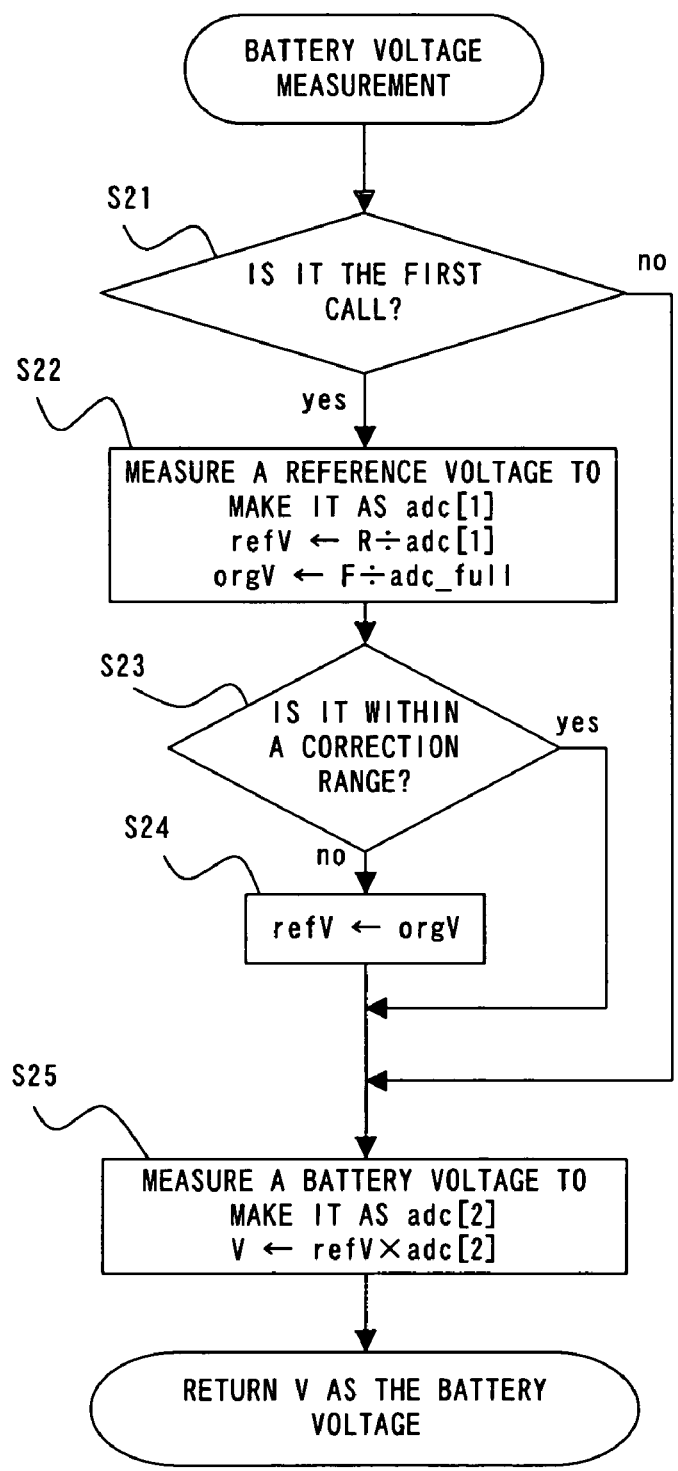
FIG. 5 is a flowchart showing a battery voltage measurement process.

FIG. 5 is a flow chart showing a battery voltage measurement process carried out as the above described step S11. The next description is of the measurement process in detail by referring to FIG. 5.

First, the step S21 judges whether or not it is the first call after turning the power on. The above described step value is retained by the RAM 204 as a variable of refV. Because the RAM 204 is volatile memory, the variable of refV has been cleared at turning the power on. Due to this, if the variable of refV is not retained by the RAM 204, the judgment is "yes", and thus the process shifts to the step S22, otherwise the judgment is "no" thereby it shifts to the step S25.

The power is turned on by operating a power switch (not shown herein). When the user operates as such, the operation is notified to the processor 205 by an interrupt signal so that the processor 205 instructs a power supply start to the power supply unit 210, although a detailed description is omitted herein.

The step S22 outputs a selection control signal in order to make the port 1 selected, obtains a digital value ("adc[1]" hereinafter) output from the A/D conversion unit 105, calculates a step value by a voltage value of a reference voltage and substitute it for the variable of refV. The step value is calculated by a voltage value of R divided by adc[1], where the R is defined as a voltage value of the reference voltage, with a value substituted for the variable of refV being retained by the RAM 204. Meanwhile, the process calculates a step value determined from a specification of the A/D conversion unit 105 and then substitutes it for a variable of orgV. This is followed by a transition to the step S23.

The step value substituted for the variable of orgV is obtained by the maximum voltage value of F, which is measurable by the A/D conversion unit 105, divided by a digital value of adc_full which is to be output at the event. This corresponds to a step value (called a "reference step value" hereinafter) to be set in the case of fixing a step value. For instance, if adopting an A/D conversion unit 105 performing a 10-bit output (i.e., 0x000 through 0x3FF) at the rated voltages of 0 through 7.5 volts, hence F=7.5−0=7.5, adc_full=0x3FF (N.B.: 0x3FF means 3FF in hexadecimal).

The step S23 judges whether or not the step value substituted for the refV is within a correction range. If it is within the range, the judgment is "yes" and the process shifts to the step S25, otherwise the judgment is "no" and the process proceeds to the step S24.

The judgment of the above described step S23 aims at preventing an excessive correction. An excessive correction misses a fact that the A/D conversion unit 105 is supposed to be regarded as failure if the A/D conversion unit 105 is defective (i.e., a measurement error is larger than a tolerable range). Therefore the aim is to identify the A/D conversion unit 105 that is supposed to be regarded as a failure.

For example, supposing that a voltage generated by a reference voltage source is 3.3 volts, that the maximum voltage measurable by the A/D conversion unit 105 is 7.5 volts and that the measurement (i.e., the conversion) result is output by a 10-bit. Under the supposition, a digital value output as a measurement result is between 0x000 and 0x3FF, a judgment of the step S23 is made by validating whether or not the difference of defV(=(refV*0x200)−(orgV*0x200)) between voltage values acquired by respective values of the variables of refV and orgV at the time of a digital value being 0x200 for example is within a predefined tolerance range. The tolerance range is specifically "−0.2 volts<defV<0.2 volts" for example. Note that the tolerance range may be integrally determined by considering a voltage value acquired by the respective values of the variables of refV and orgV, a specification of the A/D conversion unit 105, a reference voltage of R, et cetera. A value to be calculated in order to validate whether or not it is within a tolerance range may not necessarily be a difference of defV and rather may be the ratio of the value of the variable of refV to the value of the variable of orgV for example.

The step S24 substitutes a value of the variable of orgV for the variable of refV and rewrites the step value stored by the RAM 204 to the value of the variable of orgV (i.e., "the reference step value"). And it makes the RAM 204 retain the information indicating a result of being judged as "no" in the step S23. Subsequently the step S25 outputs a selection control signal for making the port 2 selected, obtains a digital value ("adc[2]" hereinafter) output by the A/D conversion unit 105 and calculates a voltage value of V of the battery 101. The calculation is carried out by the step value substituted for the variable of refV multiplied by adc[2]. The voltage value of V calculated as described above is returned as a return value of the battery voltage measurement process, followed by ending the series of processes.

As described above, the present embodiment is configured to make the A/D conversion unit 105 measure a highly accurate fixed voltage, calculate a step value from the measurement result and also validate whether or not the A/D conversion unit 105 is adequate for the measurement and store the calculated step value for use in calculating a voltage value of the battery 101 if the A/D conversion unit 105 is validated as adequate. The calculated step value is matching with an actual characteristic of the A/D conversion unit 105, that is, the present embodiment is capable of removing individual variations thereof. In the case of applying a divided voltage to the A/D conversion unit 105, where the divided voltage is obtained by using resistors which are common among ports, it is possible to eliminate an influence of errors included by these resistors. Because a voltage is calculated by using such a step value, the voltage value can be calculated securely and highly accurately.

The configuration is such that a calculation of the above described step value is performed only at the time of measuring a voltage immediately after turning the power on. This aims at suppressing an increase of power consumption by otherwise measuring a fixed voltage which is fundamentally not a subject of measurement. Even with such limitation of timing for calculating a step value, it is possible to maintain very high measurement accuracy because a possibility of a failure, or a substantial change of characteristic, of a device such as the A/D conversion unit 105 or an element thereof, occurring in a short elapse of time is very low.

The conventional voltage measurement apparatus as noted in the patent document 3 calculates a correction value for the purpose of acquiring a correct voltage value by using a result obtained by actually measuring two voltages. Comparably with that, the present embodiment is configured to calculate a step value from a result of measuring one voltage in lieu of the aforementioned correction value. This is because the size of error included in a correction value varies with the voltage value (i.e., the error tends to increase with the voltage decrease) in a power source with fluctuating voltage values due to a remaining power or a usage environment, such as the battery 101. In the present embodiment, because a step value is obtained by measuring a highly accurate fixed voltage, it is possible to avoid such an influence of an error variation.

Other reasons for limiting timing for calculating a step value as described above include as follows.

In the process of producing a portable information terminal, there is usually an inspection for validating whether or not a voltage measurement can adequately be performed. The processor 205 and the majority of components, which are all shown in FIG. 2, for performing a signal exchange therewith are commonly mounted onto a single board. Due to this, the inspection is usually conducted by a state of the board per se or that of the board being mounted within a chassis.

The inspection is usually conducted in the form of turning the power on the board, having the actual voltage measured and validating the measurement result. Consequently, the validation is desirably conducted very quickly following the power on, in order to enable a rapid inspection. Accordingly the present embodiment is configured to make a step value calculated by measuring a fixed voltage (i.e., a reference voltage) in measuring a voltage immediately after turning the power on. The reason of making the RAM 204 store, in the step S24, the judgment result of the step S23 is for the purpose of enabling the validation from the content retained by the RAM 204. Further reason of making the judgment result stored is that there is a possibility of the calculated step value being identical with a reference step value.

As described above, a measurement of a fixed voltage and a calculation of a step value using the measurement result are automatically carried out. This actually frees a worker from a work for manually changing the subjects of measurement during the inspection. This makes it possible to carry out an inspection more rapidly and easily as compared to the case of such work being necessary. Also, such automation reduces a possibility of a work fault, thereby enabling a secure identification of inadequate A/D conversion unit 105 (or a thing equipped therewith) only. These facts are also true in identifying a cause at the time of a failure occurrence.

Note that the present embodiment premises a capability of applying a voltage generated by the reference voltage source 102 and a voltage of the battery 101 to the A/D conversion unit 105 as is. However, it is not always possible to apply it. That is, there is a case of being unable to apply either one of the aforementioned voltage values to the A/D conversion unit 105 as is. In such a case, the following can be carried out.

Figure 6:
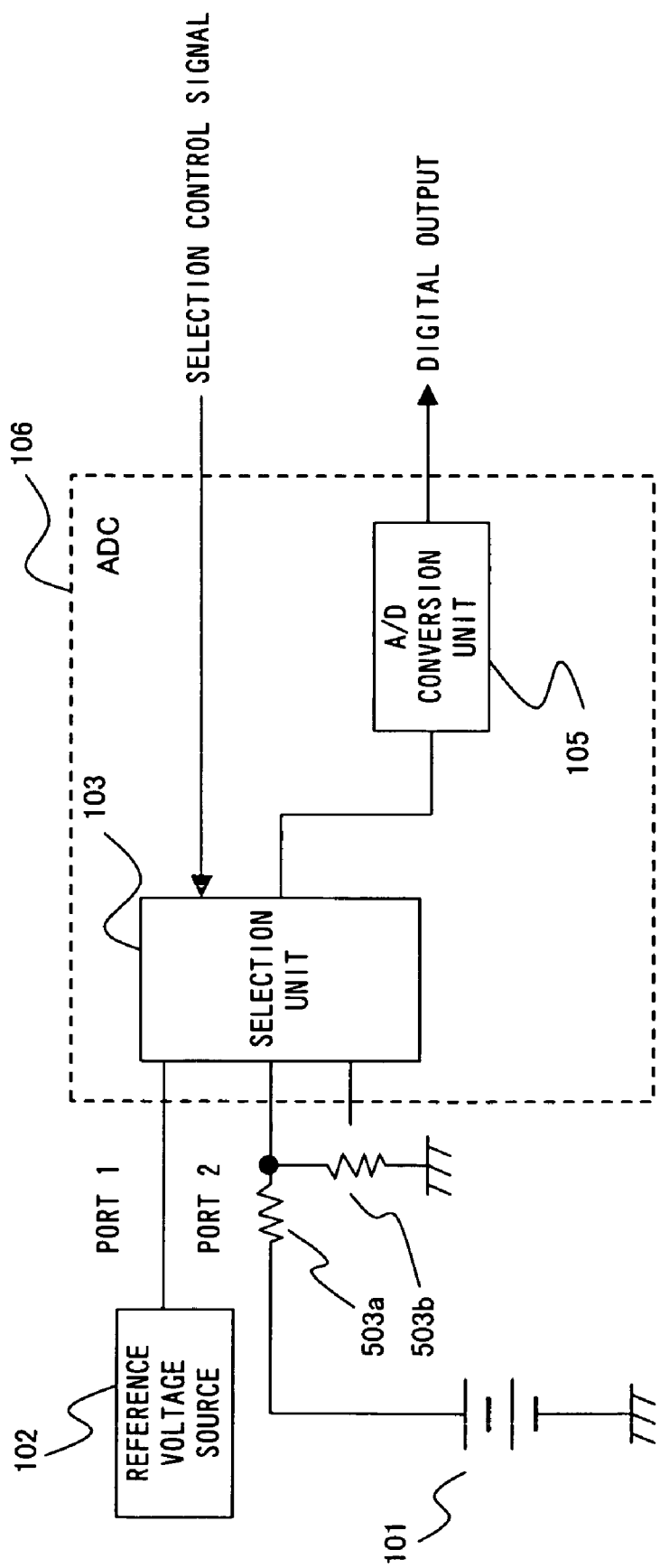
FIG. 6 is a circuit of an ADC (according to another embodiment).

FIG. 6 is a circuit of an ADC in the case of being unable to apply a voltage of the battery 101 directly thereto. In the configuration shown by FIG. 6, a reference voltage source 102 is connected to a port 1 of the ADC 106, a battery 101 is connected to a port 2 of the ADC 106, a division-use resistor 503a is connected between the battery 101 and port 2, and a resistor 503b whose one end being connected to the ground is connected between the resistor 503a and port 2. This makes the divided voltage from the battery 101 only a voltage to be divided. Due to such a configuration, a voltage measurement of the battery 101 is influenced by variations of resistances of the division resistors 503a and 503b. Therefore, the division resistors 503a and 503b with smaller error range are preferably to be used in the case of using the circuit configuration as shown by FIG. 6.

Because the voltage of the battery 101 is divided by the division resistors 503a and 503b, a calculation method used in the step S22 within the battery voltage measurement process shown by FIG. 5 is different. The processes of other steps are basically the same. Accordingly, the methods for these are specifically described in the following. Here, the description is provided by assuming that the error of the division resistors 503a and 503b is zero for convenience. Also assumed is that the specification of the A/D conversion unit 105 is the same as the above described assumption, that is, to perform a 10-bit output (0x000 through 0x3FF) at the rated voltage range of 0 through 7.5 volts. Also assumed is that the range of battery voltage is 0 through 8.4 volts, with a reference voltage being 3.3 volts. The ratio of resistance values of the two division resistors 503a to 503b is assumed to be 1.5 to 7.5. As a result of using such resistors 503a and 503b, a voltage of a voltage value of 9.0 volts is input to the A/D conversion unit 105 as a voltage of 7.5 volts. By this doing, the voltage value of 9.0 volts corresponds to a measurement value of 0x3FF.

In the step S22, for a step value, a value, which is obtained by multiplying 3.3 by 9.0 followed by dividing the product of the aforementioned multiplication by 7.5 and adc[1] (=3.3*9.0/7.5/adc[1]; Note that "*9.0/7.5" corresponds to a coefficient for a scale conversion), is substituted for the variable of refV, in order to convert into a scale of divided voltage of the battery 101. Meanwhile, for the variable of orgV, assuming the maximum voltage value R to be 9.0, a value as a result of dividing the aforementioned value of R by abc_full (=0x3FF) (=9.0/0x3FF; a reference step value) is substituted. Because the value of such acquired variable of refV is the one which is scale-converted, the judgment in the step S23 and the calculation of a voltage value of V in the step S25 can be likewise carried out.

The above described calculation method can also be applied to the case of dividing only a voltage of the reference voltage source 102. A calculation method in the case of dividing both of voltages of the battery 101 and reference voltage source 102 is the same conceptually and fundamentally. That is, a step value or a reference step value is acquired so as to match with the other scale.

In the case of being unable to ignore the difference of resistances depending on ports of the ADC 106, it is possible to respond by placing a unit such as the selection unit 103 (conveniently called a "changeover unit") at the front stage of the ADC 106 for example, and making the change over unit select a port for applying a voltage. That is, it is possible to remove a variation of resistance values depending on ports influencing the measurement by changing the ports to be applied by a reference voltage by the changeover unit and carrying out the respective voltage monitor processes as shown in FIG. 4.

In order to calculate more accurate voltage value V, it is possible to add various changes. The major change examples are specifically described in the following.

For example, in order to eliminate an influence of short time voltage fluctuation, the step S11 shown in FIG. 4 may repeat the battery voltage measurement process for a prescribed number of times (e.g., five times) and the process of the step S12 and thereafter may be carried out by using the average of the outputs obtained in the step S11 or one of the outputs whose value is the closest to the average among the outputs. Or, the step S25 shown in FIG. 5 may repeat measurement/calculation of a battery voltage for a prescribed number of times to make the average of those values a voltage value of V. Or, a median may be used in lieu of the average, or the average of values after removing the maximum and minimum values from the values obtained by repeating for a prescribed number of times.

Or, the step S22 shown in FIG. 5 may repeat a plurality of measurements of a reference voltage until a stable value is obtained. For example, a stable value is regarded as being obtained when consecutive three measurement values are identical with one another to make the identical value the adc[1]. Such a configuration further eliminates an influence of measurement values of a reference voltage becoming unstable by being affected by a voltage load immediately after starting an apparatus.

What is claimed is:

1. A portable information terminal apparatus equipped with a battery and a voltage source for generating a fixed voltage from the battery, comprising:
    a measurement unit for measuring an applied voltage by converting the applied voltage from analog to digital and outputting a measurement value according to the applied voltage;
    a changeover unit for selecting one of a plurality of voltages and applying the selected voltage to the measurement unit, where the plurality of voltages includes at least respective voltages of the battery and the voltage source; and
    a voltage value output unit for
        making the changeover unit select a fixed voltage generated by the voltage source,
        making the measurement unit measure the fixed voltage as a reference voltage, and obtain a first measurement value as a measurement result,
        generating calculation-use information based on the first measurement value and a voltage value of the reference voltage that is fixed, where the calculation-use information is for the purpose of calculating a voltage value from a measurement result of measurement unit,
        making changeover unit select a voltage by the battery,
        making the measurement unit measure the voltage of the battery and obtain a second measurement value as a measurement result, and
        calculating, and outputting, a voltage value of the battery by using the second measurement value and the calculation-use information.

2. The portable information terminal apparatus according to claim 1, wherein
    said voltage value output unit generates said calculation-use information immediately after turning a power on.

3. The portable information terminal apparatus according to claim 1, wherein
    said voltage value output unit calculates the voltage value of said battery by using said calculation-use information in a case of the calculation-use information being identical with reference calculation-use information, which is calculation-use information determined based on specification of said measurement unit, within a tolerance range.

4. A voltage measurement apparatus being equipped on a portable information terminal apparatus capable of operating by a battery, comprising:
    a measurement unit for measuring an input direct-current voltage by converting the input direct-current voltage from analog to digital;
    a changeover unit for selecting one of a plurality of voltages applied to the changeover unit to output to the measurement unit; and
    a voltage value output unit for
        making the changeover unit select a predetermined one fixed voltage from among the plurality of voltages,
        making the measurement unit measure the fixed voltage as a reference voltage and obtain a first measurement value as a measurement result,
        generating calculation-use information based on the first measurement value and a voltage value of the reference voltage that is fixed, where the calculation-use information is for the purpose of calculating a voltage value from a measurement result of the measurement unit,
        making the changeover unit select a voltage by the battery,
        making the measurement unit measure the voltage of the battery and obtain a second measurement value as a measurement result, and
        calculating, and outputting, a voltage value of the battery by using the second measurement value and the calculation-use information.

5. The voltage measurement apparatus according to claim 4, wherein
    said voltage value output unit generates said calculation-use information immediately after turning a power on.

6. The portable information terminal apparatus according to claim 1, wherein
    the voltage value output unit calculates a quotient as the calculation-use information by dividing the voltage value of the reference voltage by the first measurement value, and
    the voltage value output unit calculates the voltage value of the battery by multiplying the second measurement value by the quotient.

7. The voltage measurement apparatus according to claim 4, wherein
    the voltage value output unit calculates a quotient as the calculation-use information by dividing the voltage value of the reference voltage by the first measurement value, and
    the voltage value output unit calculates the voltage value of the battery by multiplying the second measurement value by the quotient.

* * * * *